(12) United States Patent
Corisis et al.

(10) Patent No.: US 6,462,273 B1
(45) Date of Patent: Oct. 8, 2002

(54) SEMICONDUCTOR CARD AND METHOD OF FABRICATION

(75) Inventors: David J. Corisis, Meridian, ID (US); Todd O. Bolken, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/809,781

(22) Filed: Mar. 16, 2001

(51) Int. Cl.⁷ .......................... H05K 3/28; B29C 43/40
(52) U.S. Cl. ...................... 174/52.2; 361/757; 257/679; 257/787; 264/272.17; 264/272.11; 438/112; 438/126
(58) Field of Search ................... 361/739, 746, 361/750, 752, 757, 784; 174/52.2, 52.3, 52.4, 251, 256, 258; 257/679, 687, 723, 724, 787; 235/488, 492; 29/729, 738–741, 841, 848, 849, 855, 856; 264/272.11, 272.17; 438/107, 110, 113, 114, 126, 127, 112

(56) References Cited

U.S. PATENT DOCUMENTS

| | | | | |
|---|---|---|---|---|
| 4,460,537 A | * | 7/1984 | Heinle ................... | 264/272.17 |
| 4,641,176 A | * | 2/1987 | Keryhuel et al. .......... | 174/52.3 |
| 4,688,152 A | * | 8/1987 | Chia .......................... | 174/52.2 |
| 4,772,761 A | * | 9/1988 | Ibrahim et al. ............. | 174/52.4 |
| 5,216,278 A | * | 6/1993 | Lin et al. ................... | 174/52.4 |
| 5,557,150 A | * | 9/1996 | Variot et al. ............... | 257/787 |
| 5,729,894 A | * | 3/1998 | Rostoker et al. ............ | 257/693 |
| 5,793,118 A | * | 8/1998 | Nakajima ................... | 257/706 |
| 5,841,192 A | * | 11/1998 | Exposito ..................... | 257/701 |
| 5,893,724 A | * | 4/1999 | Chakravorty et al. ....... | 438/108 |
| 5,930,603 A | * | 7/1999 | Tsuji et al. ............ | 228/180.22 |
| 5,933,328 A | | 8/1999 | Wallace et al. | |
| 6,040,622 A | * | 3/2000 | Wallace ....................... | 257/679 |
| 6,053,414 A | | 4/2000 | Stoll et al. | |
| 6,068,191 A | | 5/2000 | Dlugosch et al. | |
| 6,097,605 A | | 8/2000 | Klatt et al. | |
| 6,115,257 A | | 9/2000 | Laity | |
| 6,163,474 A | | 12/2000 | Prasanna et al. | |
| 6,184,575 B1 | | 2/2001 | Chillara et al. | |
| 6,191,951 B1 | | 2/2001 | Houdeau et al. | |
| 6,208,019 B1 | * | 3/2001 | Tane et al. ................... | 235/487 |
| 6,235,555 B1 | * | 5/2001 | Cho ........................... | 438/110 |
| 6,324,069 B1 | * | 11/2001 | Weber ........................ | 174/260 |
| 2001/0010397 A1 | * | 8/2001 | Masuda et al. ............. | 257/724 |

OTHER PUBLICATIONS

Electronic Packaging and Interconnection Handbook, Chas. Harper, ed., McGraw–Hill, Inc., publ.1991, pp. 1.33 and 1.36.*

* cited by examiner

Primary Examiner—Kamand Cuneo
Assistant Examiner—John B. Vigushin
(74) Attorney, Agent, or Firm—Stephen A. Gratton

(57) ABSTRACT

A semiconductor card includes a printed circuit substrate and one or more semiconductor components, such as dice or packages, mounted to the substrate. The substrate is initially a segment of a strip containing several substrates. The substrate is defined by a peripheral opening in the strip, and is connected to the strip by connecting segments. The card also includes a plastic body molded to the substrate and having notches that initially align with the connecting segments. The notches provide access for severing the connecting segments, and also enclose any slivers of substrate material resulting from severing of the connecting segments. A method for fabricating the package includes the steps of providing the strip, and providing a molding apparatus configured to mold the plastic body to the substrate. The molding apparatus includes pins configured to contact the connecting segments to form the notches. A system for performing the method includes the strip, the molding apparatus and a punch apparatus for severing the connecting segments.

50 Claims, 11 Drawing Sheets

SEMICONDUCTOR CARD AND METHOD OF FABRICATION

FIELD OF THE INVENTION

This invention relates generally to semiconductor manufacture, and more particularly to an improved semiconductor card, and to a method and to a system for fabricating the card.

BACKGROUND OF THE INVENTION

One type of electronic assembly containing semiconductor components is referred to as a "card". Examples of cards include multi media cards (MMC), memory cards, smart cards, and personal computer memory card international association (PCMCIA) cards. The present patent application refers to these types of cards as "semiconductor cards". These cards are also sometimes referred to as "daughter boards".

Typically, the card includes a printed-circuit substrate (usually multilayer) that provides interconnection and power distribution for semiconductor components, such as semiconductor dice or packages, on the card. The card also provides interconnect capability to a next level package, such as a mother printed-circuit board. In addition to semiconductor components, the card can include other types of electronic components such as resistors, inductors and capacitors. Typically the components are mounted to a circuit side of the board, and the external contacts for the card are contained on an opposing back side of the substrate.

In the past it has been common practice to encapsulate the semiconductor components contained on the circuit side of the substrate using a "glob top" encapsulant. The cards typically also include a separate cover adhesively attached to the substrate, which encloses all of the components on the circuit side of the card. One shortcoming of this approach is that the cover can add thickness to the card. For most applications it is desirable to make the card as thin as possible. Also, the covers are typically fabricated separately, and then attached to the substrate using an adhesive. The cover represents a separate component which requires additional process steps, and which is subject to detachment from the substrate.

Besides being as thin as possible, another requirement for these cards is that the peripheral outlines and dimensions of the cards be as consistent as possible. A typical fabrication processes is performed on a strip which is similar to a lead frame and contains several printed circuit substrates. The individual cards are then separated from the strip using a singulation step such as sawing. Often the singulation step produces slivers, and roughened portions on the edges of the printed-circuit substrate. These defects can adversely affect the peripheral outline, dimensions and appearance of the card. Specifications on the peripheral outline and dimensions of cards, have been set by various industry standard setting bodies (e.g., PCMCIA). Defects such as slivers of substrate material, can make the peripheral outline of the card larger, such that the card does not meet the specifications.

The present invention is directed to a semiconductor card in which the components on the printed circuit substrate are encapsulated in a molded plastic body, such that the card can be made as thin as possible. In addition, the fabrication process employs a strip of substrate material, and a singulation step, designed to reduce defects, such as substrate slivers and dimensional irregularities.

SUMMARY OF THE INVENTION

In accordance with the present invention, an improved semiconductor card, and a method and a system for fabricating the card are provided.

The card includes a printed circuit substrate, which comprises an electrically insulating material, such as an organic polymer resin reinforced with glass fibers. The substrate includes a circuit side with a pattern of conductors thereon, a back side with a pattern of external contacts thereon, and a plurality of interlevel conductors which electrically connect the conductors on the circuit side to the external contacts on the back side. The substrate is initially a segment of a strip containing multiple substrates. The strip is similar in function to a semiconductor lead frame, and allows various fabrication processes to be performed on several substrates at the same time. The substrate is connected to the strip with connecting segments that are similar in function to tie bars on a semiconductor lead frame. In addition, a peripheral outline of the substrate is defined by a peripheral opening in the strip.

The card also includes one or more semiconductor components mounted to the circuit side of the substrate in electrical communication with the conductors on the circuit side. The semiconductor components can comprise bare dice wire bonded to the conductors, bumped dice flip chip mounted to the conductors, or semiconductor packages bonded to the conductors. The card also includes a molded encapsulant on the circuit side of the substrate which encapsulates the components. The card also includes a molded plastic body which covers the encapsulant, the remainder of the circuit side, and the edges of the substrate.

The plastic body includes one or more notches formed on edge portions thereof in alignment with the connecting segments for the substrate. Although most portions of the connecting segments are removed during singulation of the substrate from the strip, some portions of the connecting segments (e.g., slivers) can remain in the notches following the singulation step. However, because the notches are configured to enclose these remaining portions of the connecting segments, the peripheral outline and dimensions of the card can still meet specification. The notches in addition to enclosing defects on the substrate also function to provide access to the connecting segments for singulating the substrate from the strip.

A method for fabricating the semiconductor card includes the initial step of providing the strip containing multiple printed circuit substrates. The peripheral outline of each substrate on the strip is defined by the peripheral openings through the strip, and each substrate is connected to the strip by the connecting segments. In addition, the method includes the steps of mounting the semiconductor components to the substrates on the strip, and then encapsulating the semiconductor components.

Following the encapsulating step, a molding step is performed to mold the plastic bodies to the substrates on the strip. The molding step can be performed using a molding apparatus having mold cavities configured to mold the plastic bodies to the strips. The mold cavities include pins configured to contact the connecting segments for the substrates, and to form the notches in the plastic bodies in alignment with the connecting segments. Following the molding, a singulation step is performed by severing the connecting segments to separate the substrates from the strip. During the singulation step, the notches provide access for severing the connecting segments. In addition, any slivers from the connecting segments remain in the molded notches such that the peripheral outline of the card meets specification.

A system for performing the method includes the strip containing multiple printed circuit substrates connected to the strip by the connecting segments and defined by the peripheral openings in the panel. In addition, the system includes the molding apparatus having the mold cavities for molding the plastic bodies to the substrates. The system also includes the pins in the molding cavities configured to mold the notches into the plastic bodies and to hold the connecting segments down during the molding step. The system also includes a punch apparatus having cutters configured to move through the notches in the plastic bodies to sever the connecting segments.

DETAILED DESCRIPTION OF THE PREFERRED EMBODIMENT

Figure 1A:
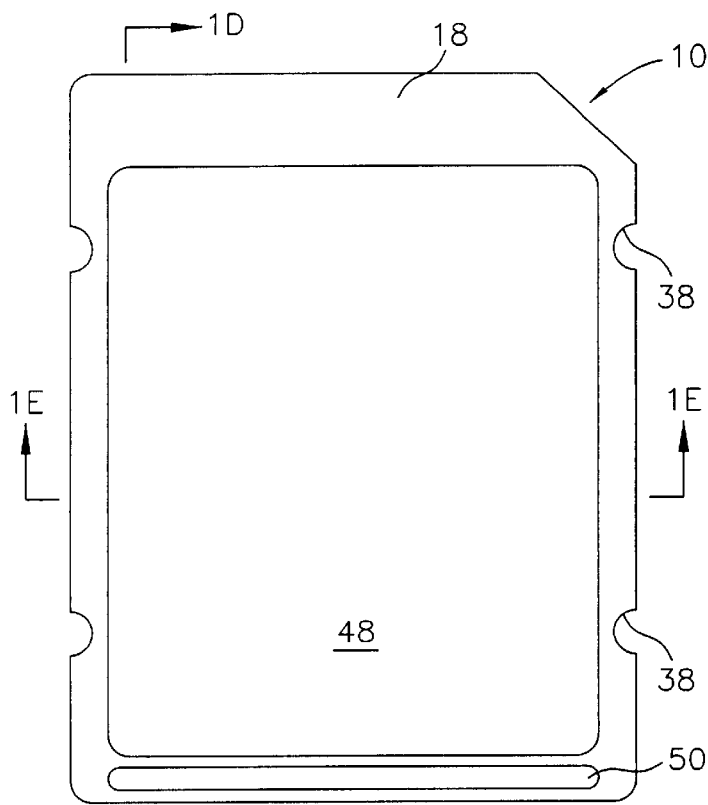
FIG. 1A is an enlarged plan view of a semiconductor card fabricated in accordance with the invention.
Figure 1C:
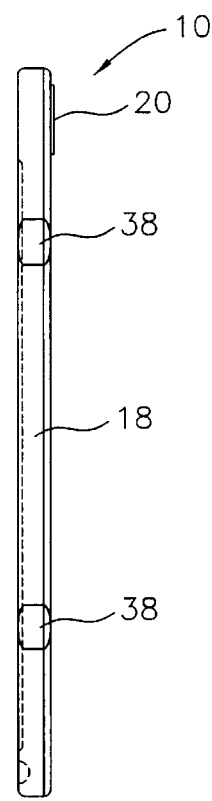
FIG. 1C is an enlarged side elevation view of the semiconductor card.

Referring to FIGS. 1A–1G, a semiconductor card 10 constructed in accordance with the invention is illustrated. The card 10 includes a printed circuit substrate 12, and a plurality of semiconductor components 14 (FIG. 1E) mounted to the substrate 12. The card 10 also includes an encapsulant 16 (FIG. 1E) on the substrate 12 encapsulating the components 14, a plastic body 18 molded to the encapsulant 16 and to the substrate 12, and an array of external contacts 20 (FIG. 1B) on the substrate 12.

The substrate 12 comprises an electrically insulating material such as an organic polymer resin reinforced with glass fibers. Suitable materials for the substrate 12 include bismaleimide-triazine (BT), epoxy resins (e.g., "FR-4" and "FR-5"), and polyimide resins. These materials can be formed with a desired thickness, and then punched, machined, or otherwise formed with a required peripheral configuration, and with required features. A representative thickness of the substrate 12 can be from about 0.2 mm to 1.6 mm. As will be further explained, the substrate 12 is initially a segment of a strip 30 (FIG. 3A) which is used to fabricate several cards 10 at the same time.

Figure 1B:
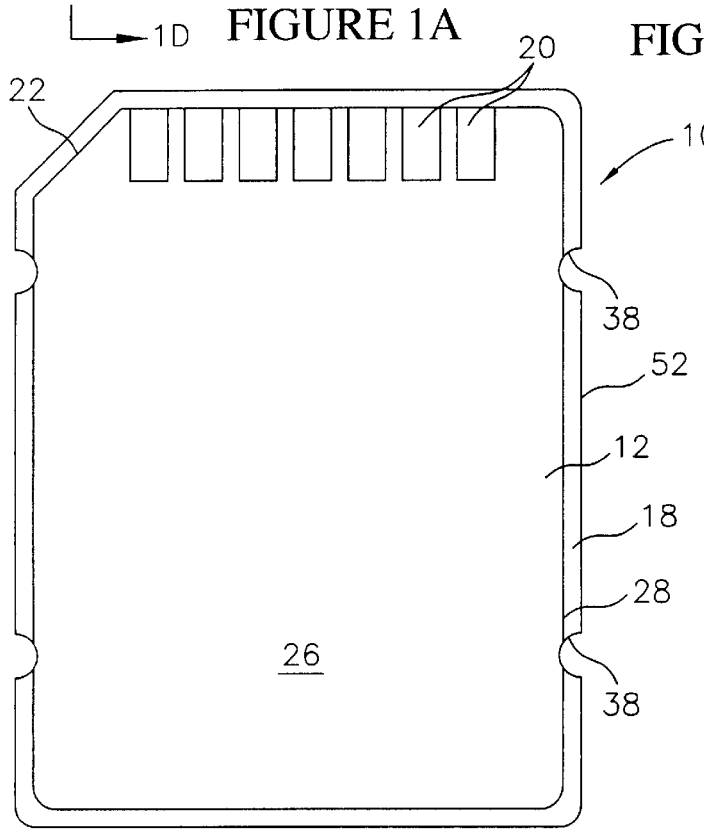
FIG. 1B is an enlarged bottom view of the semiconductor card.
Figure 1D:
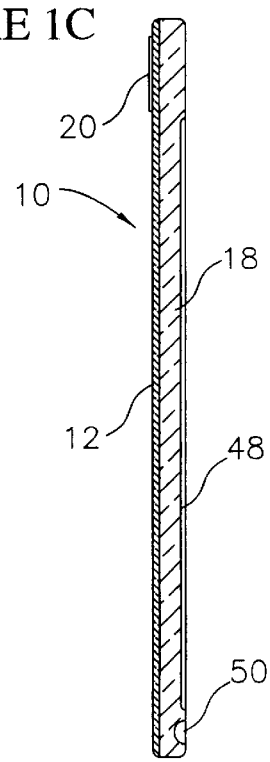
FIG. 1D is an enlarged cross sectional view of the semiconductor card, taken along section line 1D—1D of FIG. 1A.

As shown in FIG. 1B, the substrate 12 has a generally rectangular peripheral shape but with one chamfered corner 22. The substrate 12 includes a circuit side 24 (FIG. 1G) wherein the semiconductor components 14 are mounted, a back side 26 (FIG. 1B) wherein the external contacts 20 are located, and a peripheral edge 28 (FIG. 1B). As shown in FIG. 1G, the circuit side 24 of the substrate 12 includes patterns of conductors 32 and contacts 36. For simplicity only a few of the conductors 32 are shown. The conductors 32 can comprise a highly conductive metal, such as copper, and are configured to provide separate electrical paths on the substrate 12 for the electrical components contained on the card 10. The contacts 36 provide electrical connection points for performing various electrical functions, such as testing the semiconductor components 14, or other circuits and components on the substrate 12. The substrate 12 also includes conductive vias (not shown), or other interlevel conductors, that provide separate electrical paths through the substrate 12 between the conductors 32, the contacts 36, the components 14, and the external contacts 20 (FIG. 1B).

In addition to the semiconductor components 14, the card also includes various other electrical components 40 on the substrate 12, such as resistors, capacitors and inductors in electrical communication with the conductors 32 and with the semiconductor components 14. The semiconductor components 14, the conductors 32, and the electrical components 40 form a circuit 42 (FIG. 1G) on the substrate 12 that is configured to perform a desired function (e.g., memory storage, sound production, video production, product identification, etc.).

The external contacts 20 on the substrate 12 provide connection points for sending signals to the circuit 42 or for receiving signals generated by the circuit 42. The external contacts 20 are configured for mating electrical engagement with corresponding contacts (not shown) on a mother circuit board or other electrical assembly (not shown). In the illustrative embodiment the external contacts 20 comprise planar pads formed of a non-oxidizing material such as gold. However, other configurations for the external contacts 20 can be employed (e.g., bumps, pins, etc.).

Figure 1E:
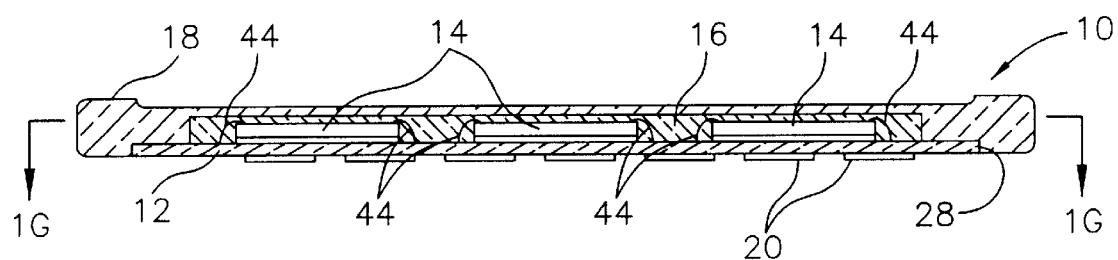
FIG. 1E is an enlarged cross sectional view of the semiconductor card, taken along section line 1E—1E of FIG. 1A.

As shown in FIG. 1E, the components 14 can comprise bare semiconductor dice wire bonded to the substrate 12. In this case, wires 44 are bonded to bond pads 62 (FIG. 1G) on the components 14, and to corresponding bond pads 34 (FIG. 1G) on the substrate 12 in electrical communication with the conductors 32. As also shown in FIG. 1E, the encapsulant 16 encapsulates the components 14, the wires 44 and the associated wire bonds as well. The encapsulant 16 can comprise a suitable curable polymer such as a "glob top"

material, an epoxy resin, or a silicone material deposited and formed using a suitable process (e.g., molding, dispensing through a nozzle). Depending on the encapsulant a curing step for the encapsulant such as heating in a oven may also be required.

Figure 1F:
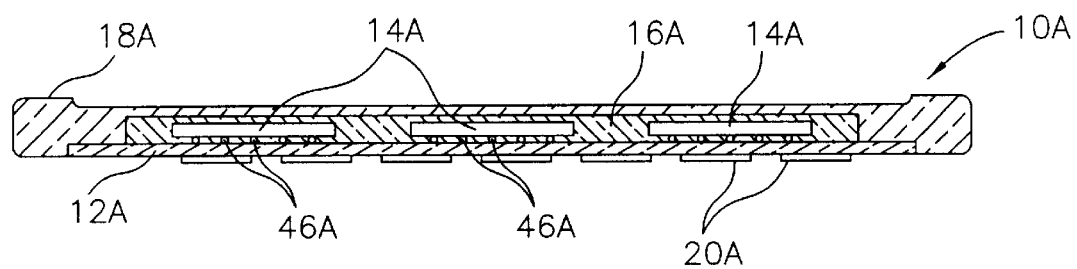
FIG. 1F is an enlarged cross sectional view, equivalent to FIG. 1E, of an alternate embodiment semiconductor card.
Figure 1G:
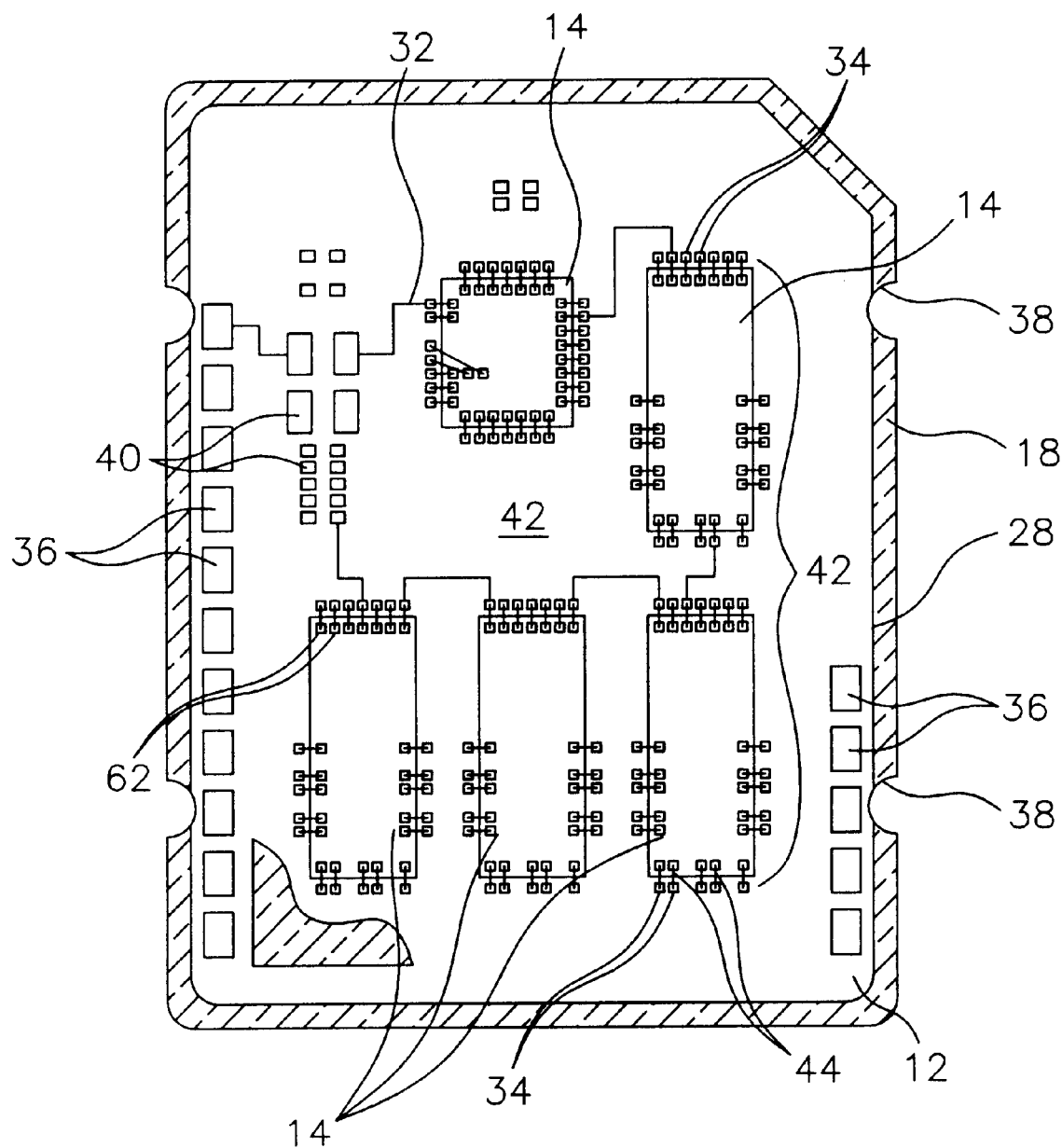
FIG. 1G is an enlarged cross sectional view of the semiconductor card, taken along section line 1G—1G of FIG. 1E.

As an alternative to wire bonding, and as shown in FIG. 1F, a semiconductor card 10A can include semiconductor components 14A in the form of dice or packages flip chip mounted to a substrate 12A, or semiconductor packages (e.g., TSOPs, chip scale packages) bonded to the substrate 12A. In either case, contacts 46A on the components 14A, such as solder balls or C4 bumps, are bonded to corresponding contacts on the substrate 12A. In addition, an encapsulant 16A encapsulates the components 14A, and external contacts 20A on the substrate 12A provide outside electrical connection points for the card 10A. The card 10A also includes a molded plastic body 18A substantially similar to the molded plastic body 18 for card 10.

Referring again to FIGS. 1A and 1B, the molded plastic body 18 for card 10 completely covers the circuit side 24 of the substrate 12. In addition, the molded plastic body 18 has a peripheral outline that substantially matches, but is slightly larger than the peripheral outline of the substrate 12. As will be further explained, the molded plastic body 18 can comprise a Novolac based epoxy formed in a desired shape using a transfer molding process, and then cured using an oven.

As shown in FIG. 1B, the molded plastic body 18 also includes an edge portion 52 that covers the peripheral edge 28 of the substrate 12 but leaves the backside 26 of the substrate 12 and the external contacts 20 exposed. In addition, as shown in FIGS. 1A and 1D, the molded plastic body 18 includes a recessed face portion 48 configured to retain a label. The label, for example, can comprise a pre-printed sheet of paper having art work on one side, and an adhesive on an opposing side. As also shown in FIGS. 1A and 1D, the molded plastic body 18 includes a groove 50 that functions as a finger grip for handling the card 10.

As also shown in FIGS. 1A and 1B, the molded plastic body 18 includes notches 38 formed in the edge portion 52. In the illustrative embodiment, the notches 38 are generally hemispherical in shape, and extend completely through the edge portion 52 of the molded plastic body 18. The notches 38 can also extend a short distance into the substrate 12 such that the peripheral edge 28 of the substrate 12 is slightly notched. In the illustrative embodiment, there are four notches 38 consisting of two pairs located on opposing longitudinal sides of the card 10. The notches 38 align with connecting segments 54 (FIG. 3A) of the substrate 12 that initially attach the substrate 12 to the strip 30. One function of the notches 38 is to provide access for severing the connecting segments 54 to singulate the substrate 12, and the card 10, from the strip 30 following the fabrication process. Another function of the notches 38 is to provide an enclosed area for containing rough edges of the substrate 12, or slivers of substrate material, that may form during severing of the connecting segments 54.

Figure 2A:
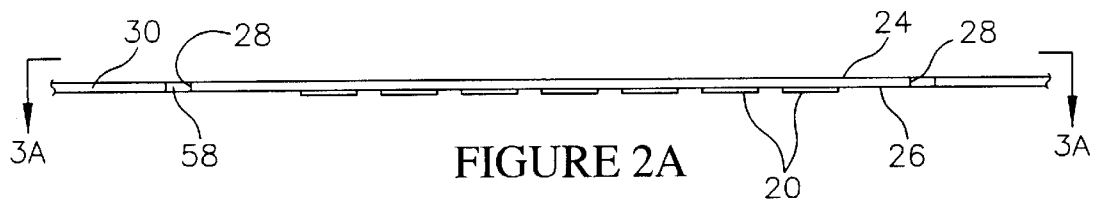
FIGS. 2A—2F are schematic cross sectional views illustrating steps in a method for fabricating the semiconductor card in accordance with the invention.
Figure 2B:
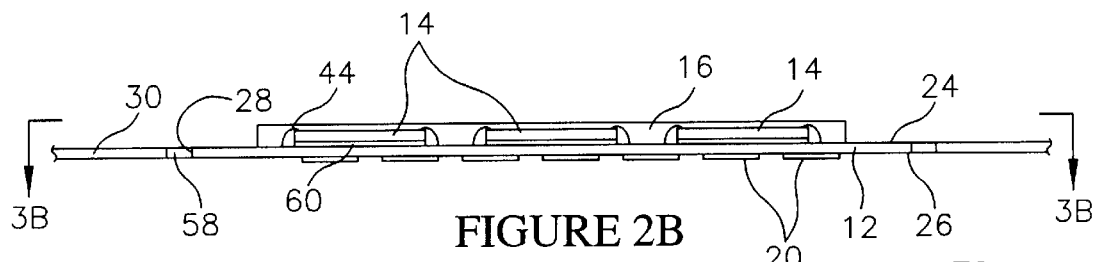
Figure 2C:
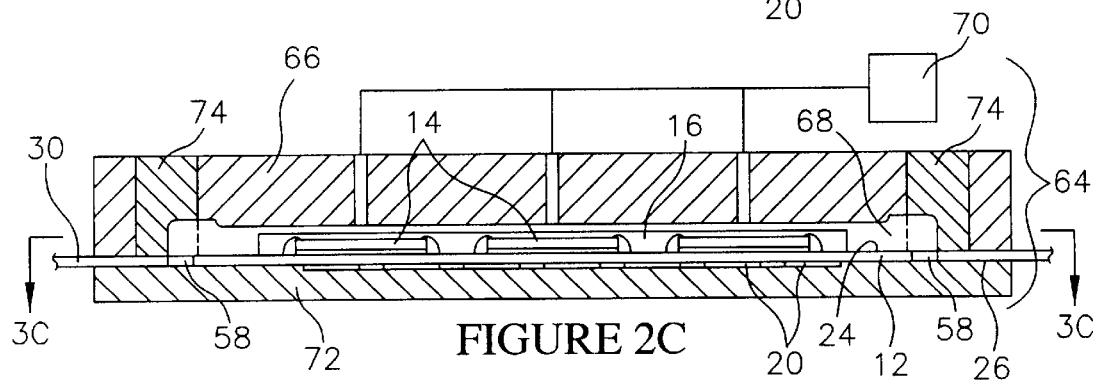
Figure 2D:
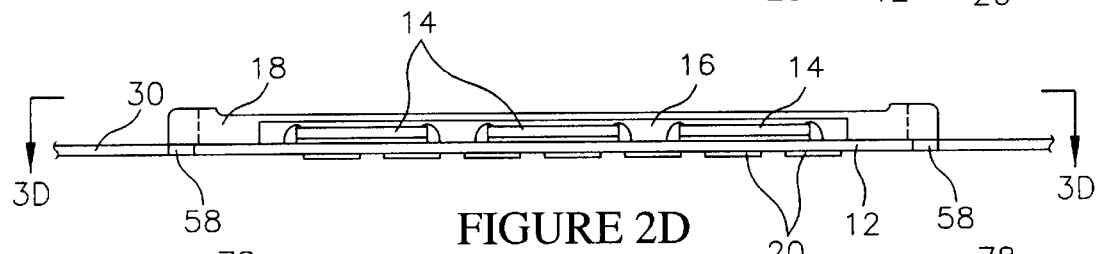
Figure 2E:
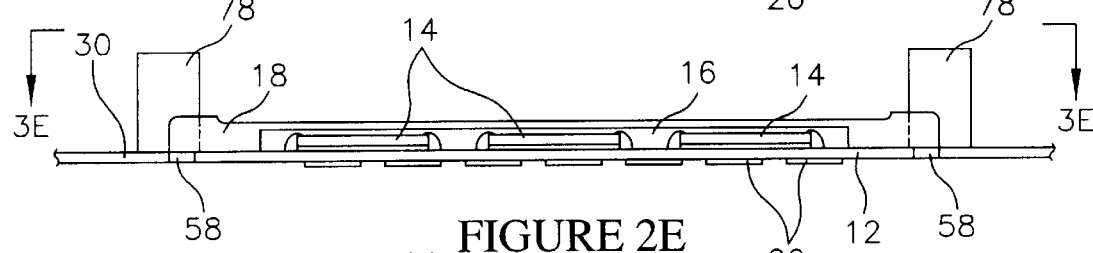
Figure 2F:
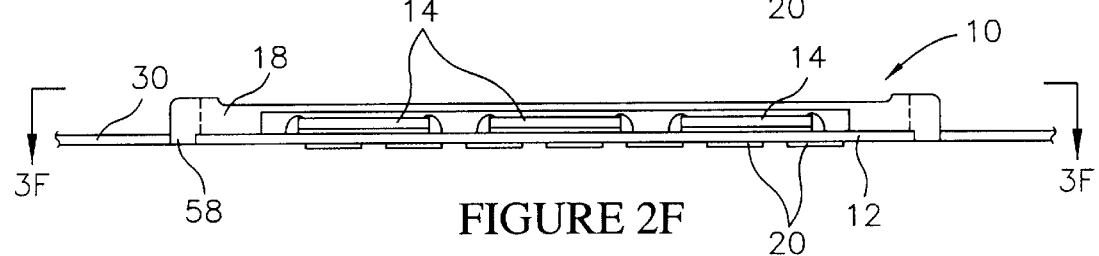
Figure 3A:
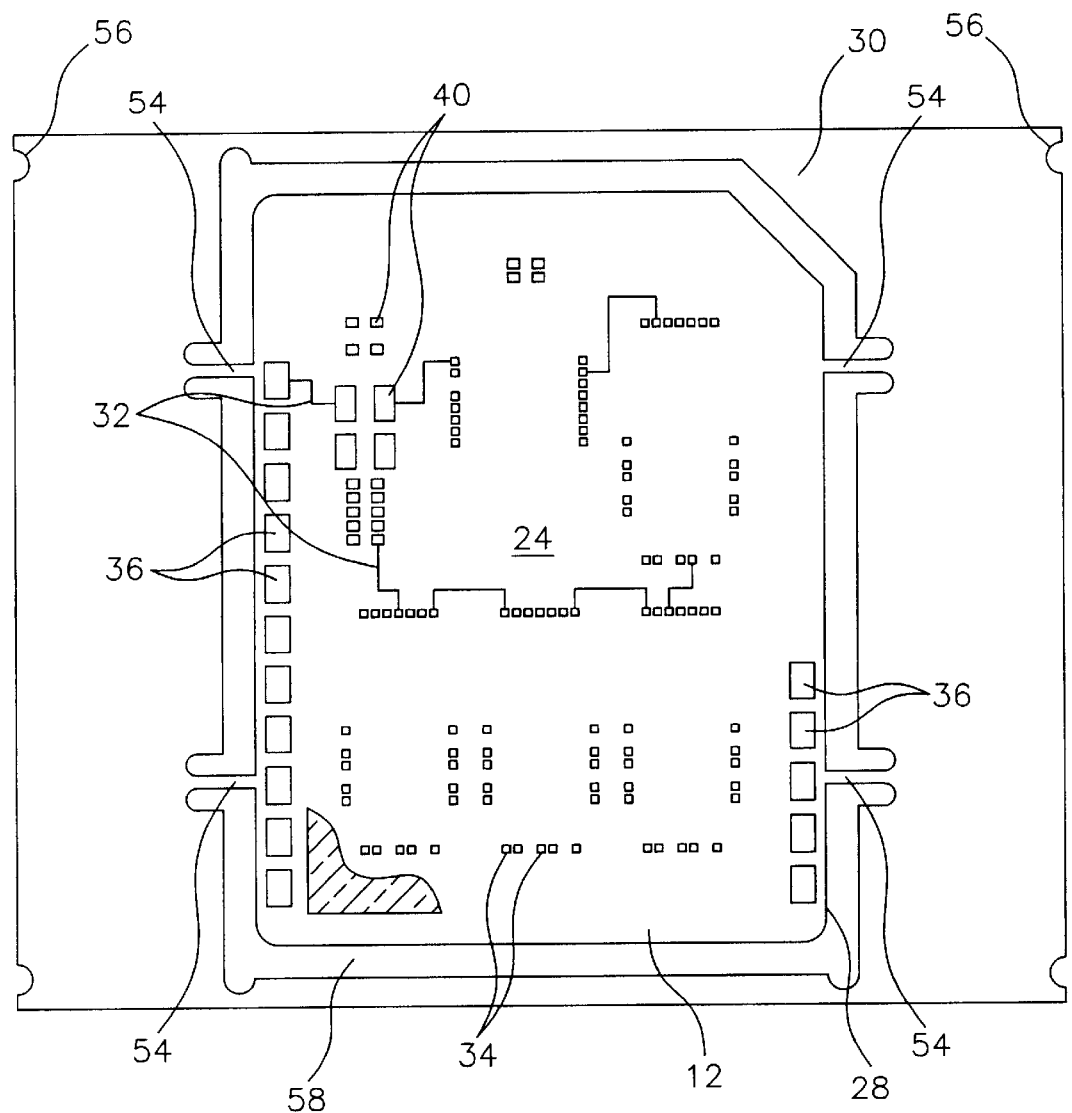
FIG. 3A is an enlarged schematic plan view of the semiconductor card during fabrication, taken along line 3A—3A of FIG. 2A.

Referring to FIGS. 2A–2F and 3A–3F, steps in a method for fabricating the card 10 are illustrated. Initially as shown in FIGS. 2A and 3A, the strip 30 containing the substrate 12, as well as additional substrates 12 (not shown) is provided. The strip 30 can also be described as a panel similar in construction to a semiconductor lead frame, and can include as many substrates as desired (e.g., two to eighteen). The strip 30 facilitates the fabrication process in that different operations, such as die attach, wire bonding, molding and singulation can be performed at the same time on multiple substrates 12. If desired, the strip 30 can be constructed from a commercially produced bi-material core, such as a copper clad bismaleimide-triazine (BT) core, available from Mitsubishi Gas Chemical Corp., Japan. A representative weight of the copper can be from 0.5 oz to 2 oz. per square foot.

As shown in FIG. 3A, the strip 30 can include indexing openings 56 that facilitate handling by automated equipment such as conveyors, magazines, die attachers, wire bonders and molding apparatus. In addition, the substrate 12 on the strip 30 can include the conductors 32, the contacts 36 and the electrical components 40, configured substantially as previously described, on the circuit side 24 of the substrate 12. Similarly, the substrate 12 can include the external contacts 20 on the backside 26, and the vias (not shown) which electrically connect the external contacts 20 to the conductors 32, to the electrical components 40 and to the contacts 36.

The strip 30 also includes the connecting segments 54 configured to attach the substrate 12 to the strip 30. The connecting segments 54 are similar in structure and function to tie bars of a semiconductor lead frame. As also shown in FIG. 3A, a peripheral opening 58 though the strip 30 defines the peripheral outline of the substrate 12. The peripheral opening 58 is continuous except where the connecting segments 54 are located.

Figure 3B:
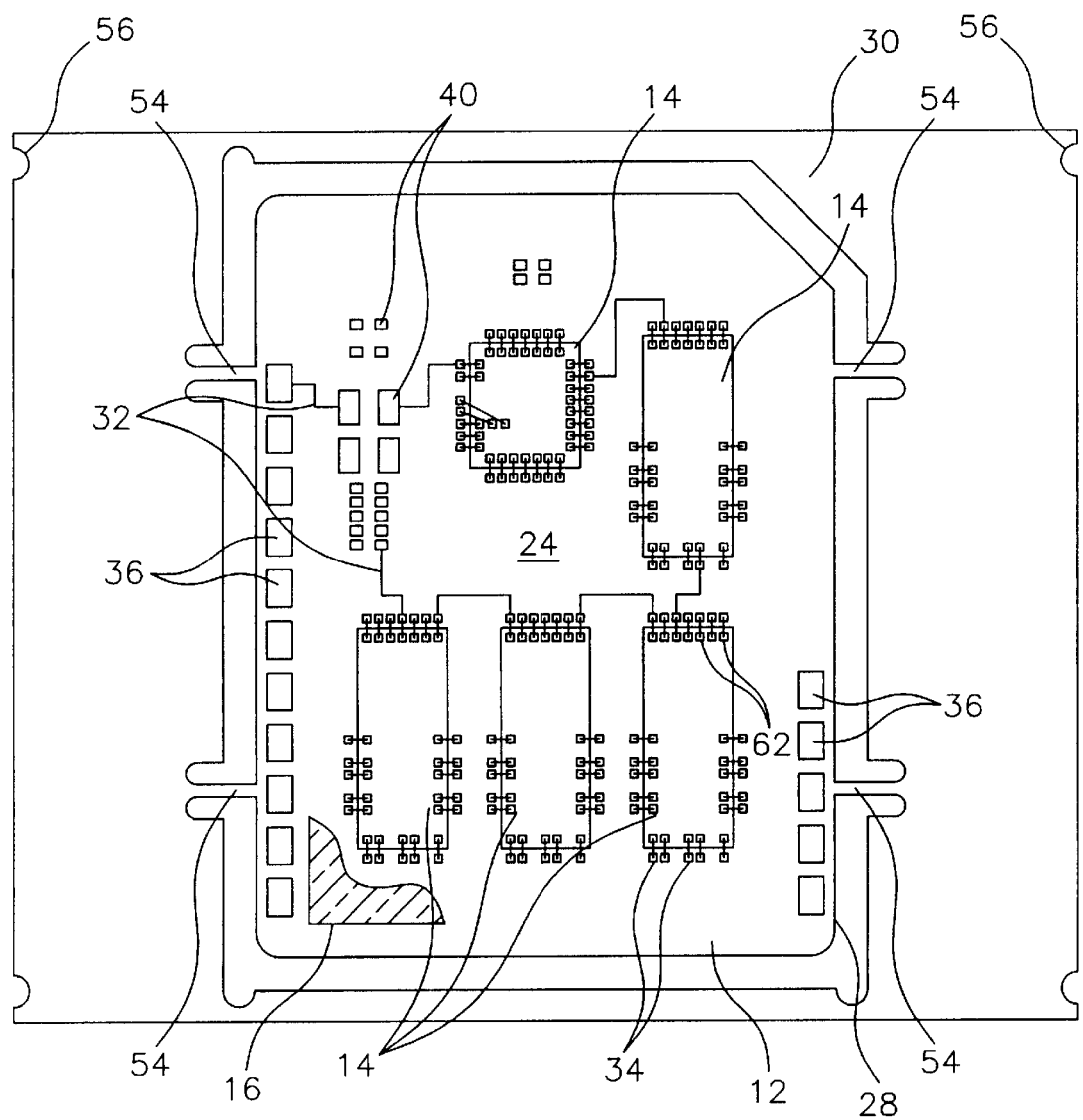
FIG. 3B is an enlarged schematic plan view of the semiconductor card during fabrication, taken along line 3B—3B of FIG. 2B, and partially cut away.

Next, as shown in FIGS. 2B and 3B, the semiconductor components 14 are mounted to the circuit side 24 of the substrate 12. Adhesive layers 60 (FIG. 2B) such as a curable adhesive (e.g., polyimide), or a tape material ("KAPTON" tape), can be used to adhesively attach the semiconductor components 14 to the substrate 12. Also, a conventional die attacher can be used to perform the attachment process.

As shown in FIG. 3B, the semiconductor components 14 can be wire bonded to the substrate 12 by bonding the wires 44 to the bond pads 62 on the semiconductor components 14 and to the bond pads 34 on the substrate 12. A conventional wire bonder can be used to perform the wire bonding step. Alternately, instead of wire bonding, a flip chip process (e.g., C4), or a TAB bonding process, can be used to electrically connect the semiconductor components 14 to the conductors 32.

As another alternative, the semiconductor components 14A (FIG. 1F) can include contacts 46A (FIG. 1F) such as solder balls configured for bonding to the bond pads 34 on the substrate 12 using a solder reflow process. Alternately, the contacts 46A (FIG. 1F) can comprise conductive polymer bumps configured for bonding to the bond pads 34 on the substrate 12 using a curing process.

As also shown in FIGS. 2B and 3B, following wire bonding, the encapsulant 16 can be formed on the semiconductor components 14 and on portions of the substrate 12. The encapsulant 16 can comprise a glob top material, such as an epoxy resin or silicone, deposited using a suitable deposition process and then cured. As another alternative the encapsulant 16 can comprise a Novolac based epoxy formed in a desired shape using a transfer molding process, and then cured using an oven.

Figure 3C:
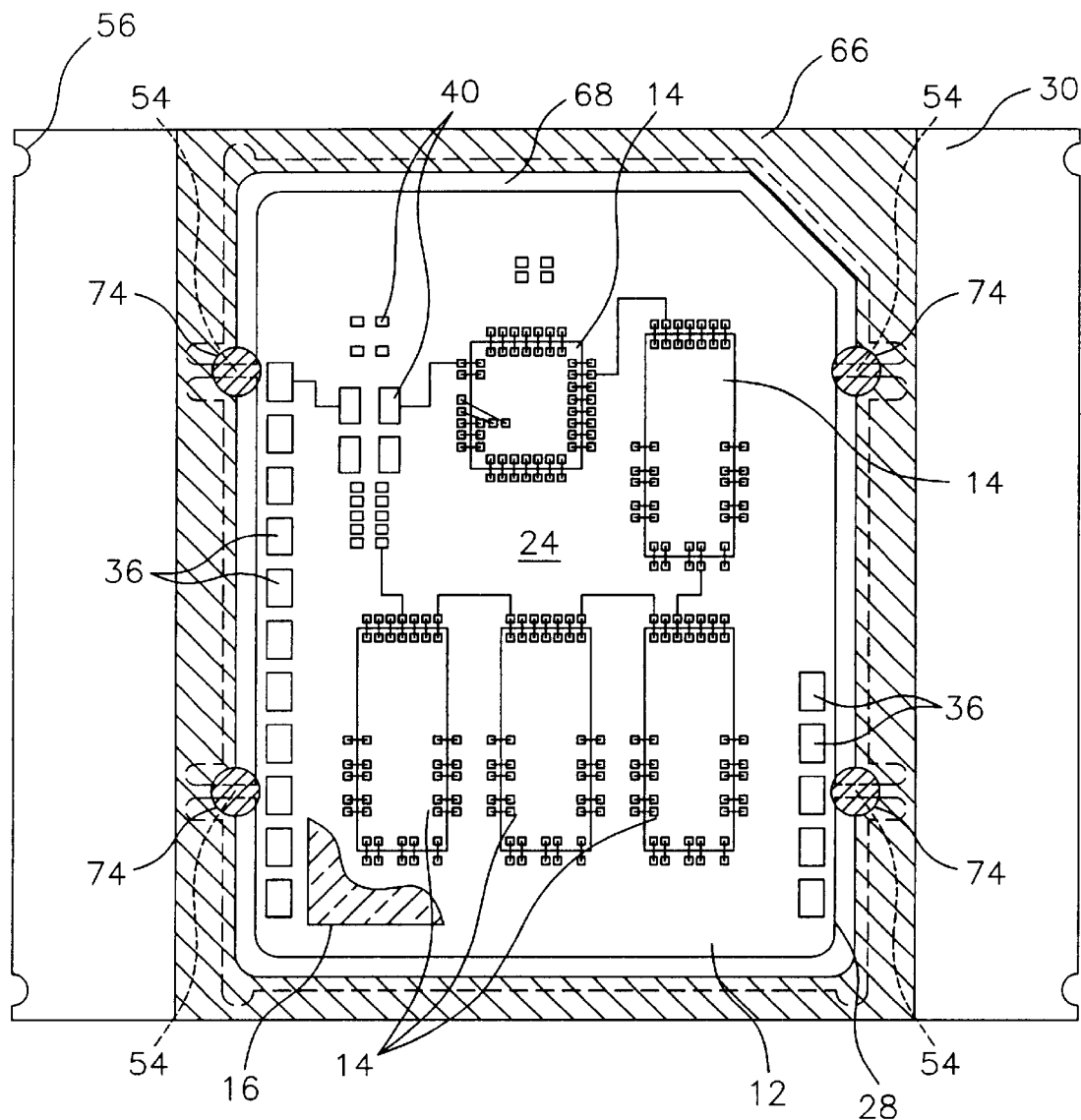
FIG. 3C is an enlarged schematic plan view of the semiconductor card during fabrication, taken along line 3C—3C of FIG. 2C, and partially cut away.

Next, as shown in FIGS. 2C and 3C, the molded plastic body 18 is formed using a molding apparatus 64. The molding apparatus 64 can comprise a conventional transfer molding apparatus modified to include pins 74 to be hereinafter described. The molding apparatus 64 includes a first plate 66 configured to contact the circuit side 24 of the substrate 12. In addition, the molding apparatus 64 includes a second plate 72 configured to contact the back side 26 of the substrate 12. If desired, the back side 26 of the substrate 12 can be protected by tape or other protective member during the molding process.

The first plate 66 of the molding apparatus 64 includes a mold cavity 68 in fluid communication with a pressurized source 70 of a molding compound such as a Novolac based epoxy. The mold cavity 68 is adapted to receive the molding compound and to mold the molded plastic body 18 over the encapsulant 16, and on the circuit side 24 and peripheral edge 28 of the substrate 12. In addition, the mold cavity 68 is adapted to define features of the molded plastic body 18 such as the face portion 48 (FIG. 1A) and the groove 50 (FIG. 1A).

The first plate 66 and the second plate 72 are configured to apply pressure to the substrate 12 during the molding process to prevent molding compound from forming on portions of the substrate 12 such as on the back side 26 thereof (i.e., to prevent "flash" from forming). The first plate 66 also includes four pins 74 located within the mold cavity 68, which are configured to form the notches 38 (FIG. 1B) in the molded plastic body 18.

As shown in FIG. 3C, the pins 74 align with the connecting segments 54 which attach the substrate 12 to the strip 30. The pins 74 are configured to contact the connecting segments 54 during the molding process. This forms the notches 38 (FIG. 1B) in the molded plastic body 18 in exact alignment with the connecting segments 54. The pins 74 are also configured to apply pressure to the connecting segments 54, such that molding compound does not flow beneath the connecting segments 54 and form "flash" on the back side 26 of the substrate 12. In the illustrative embodiment the pins 74 are generally cylindrically shaped and form the notches 38 with a hemispherical shape. However, the pins 74 can have other geometrical configurations adapted to form the notches 38 in other shapes (e.g., square, rectangular, quarter moon, etc.).

Figure 3D:
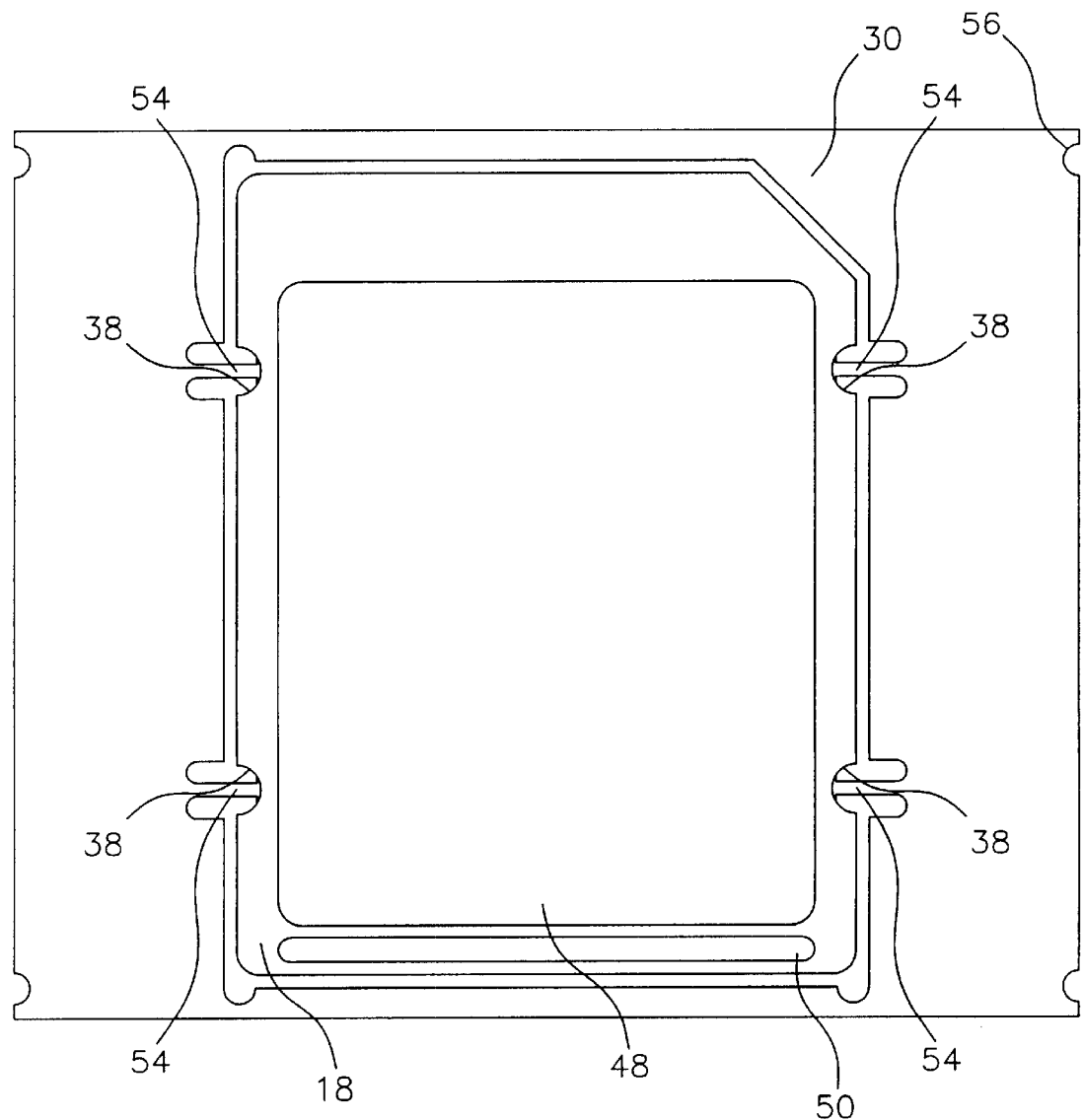
FIG. 3D is an enlarged schematic plan view of the semiconductor card during fabrication, taken along line 3D—3D of FIG. 2D.

Referring to FIGS. 2D and 3D, the molded plastic body 18 is shown following the molding process. As shown in FIG. 3D, the notches 38 in the molded plastic body 18 are aligned with the connecting segments 54. However, the connecting segments 54 remain intact such that the substrate 18 remains connected to the strip 30.

Figure 3E:
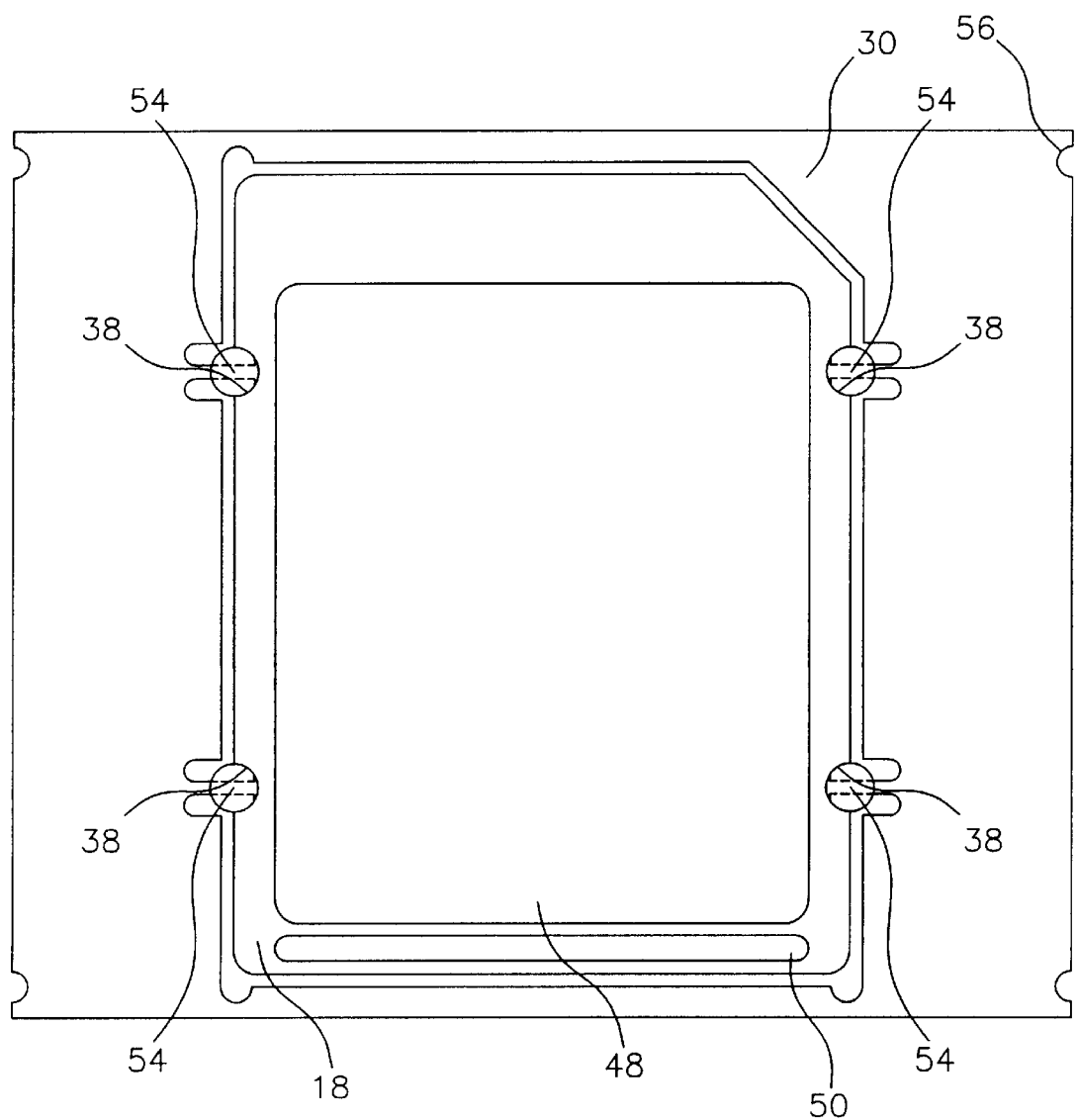
FIG. 3E is an enlarged schematic plan view of the semiconductor card during fabrication, taken along line 3E—3E of FIG. 2E.

Next, as shown in FIGS. 2E and 3E, a singulating step is performed to sever the connecting segments 54 and separate the substrate 18 from the strip 30. For performing the singulating step, a punch apparatus 76 can be provided. The punch apparatus 76 can comprise a conventional punch or press that includes cutters 78 configured to sever the connecting segments 54 at their point of attachment to the substrate 18. The cutters 78 are sized and shaped similarly to the pins 74, such that they are able to move through the notches 38 to sever the connecting segments 54. The notches 38 thus provide access for the cutters 78 to the connecting segments 54.

Figure 3F:
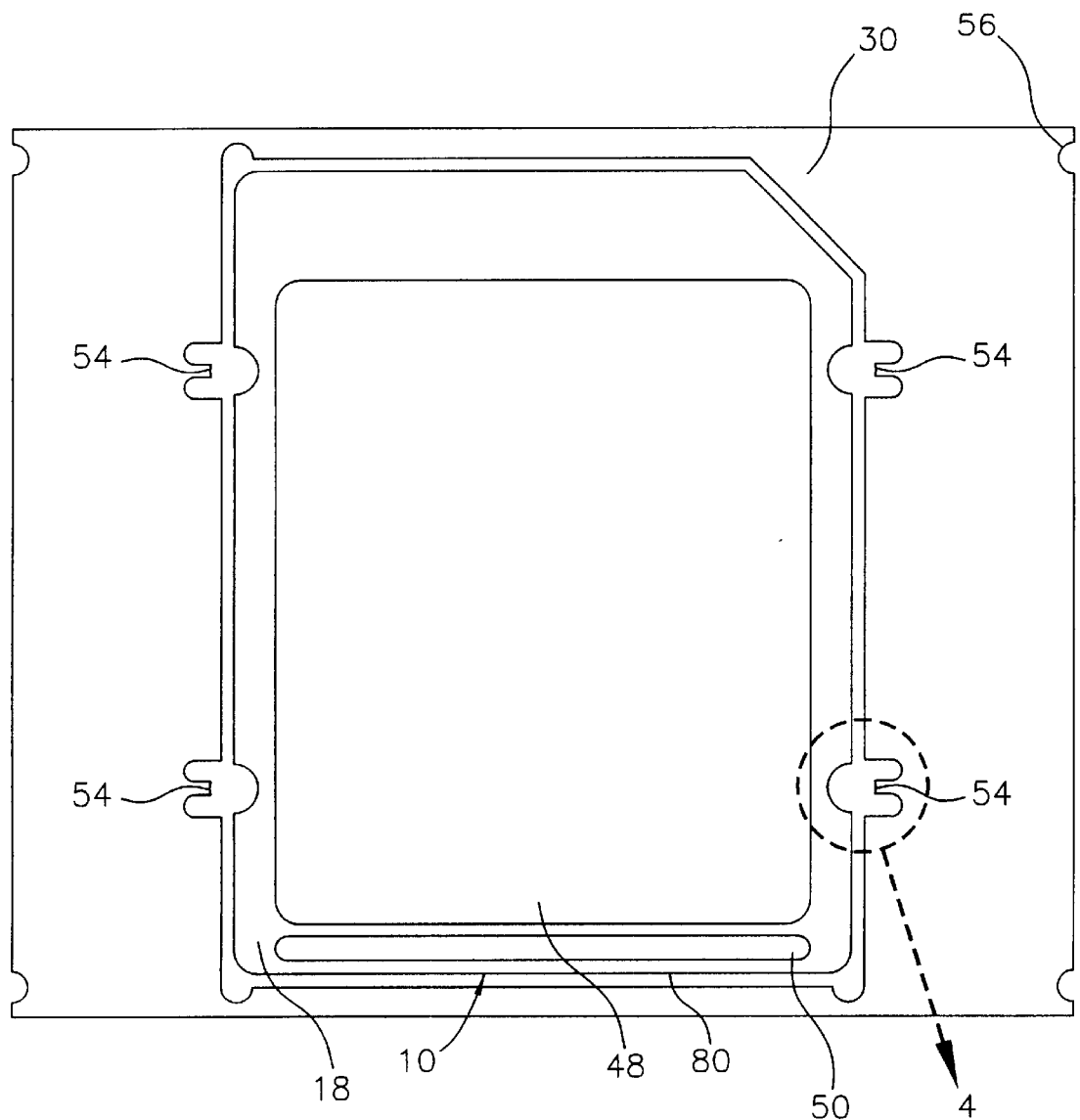
FIG. 3F is an enlarged schematic plan view of the semiconductor card during fabrication, taken along line 3F—3F of FIG. 2F.

Referring to FIGS. 2F and 3F, the card 10 is illustrated following the singulating step but prior to removal from the strip 30. As shown in FIG. 3F, a peripheral outline 80 of the card 10 is defined by the peripheral opening 58 through the strip 30. In addition, the connecting segments 54 in the opening 58 have been severed such that the card 10 can be removed from the strip 30.

Figure 4:
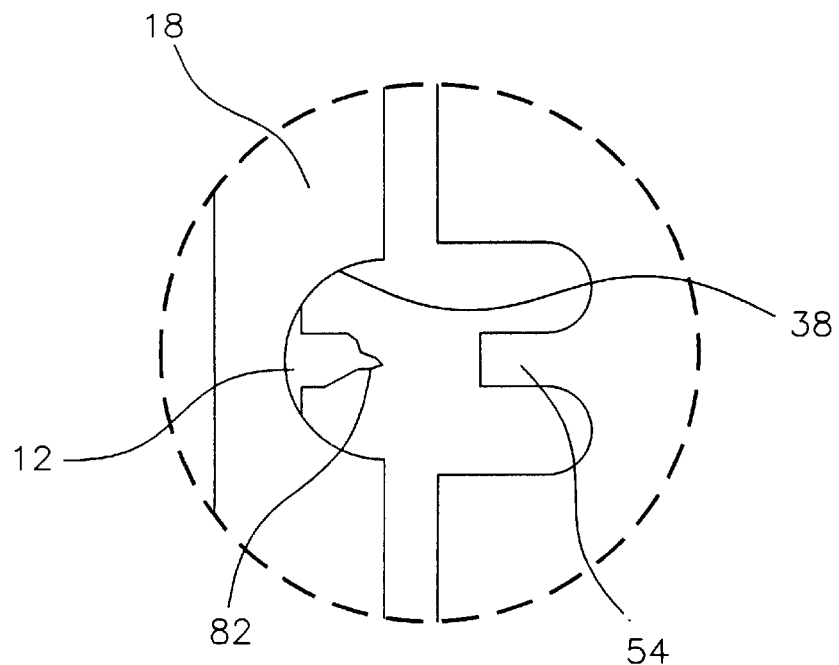
FIG. 4 is an enlarged cross sectional view taken along section line 4 of FIG. 3F.

Referring to FIG. 4, one of the notches 38 is shown in an enlarged view. In this case, the connecting segment 54 was not cleanly severed such that a sliver 82 of substrate material remains. However, the sliver 82 is contained within the notches 38 such that the peripheral outline and dimensions of the card 10 will meet specification. The notches 38 also function to shield rough edges that may have resulted from shearing of the connecting segments 54.

Figure 5:
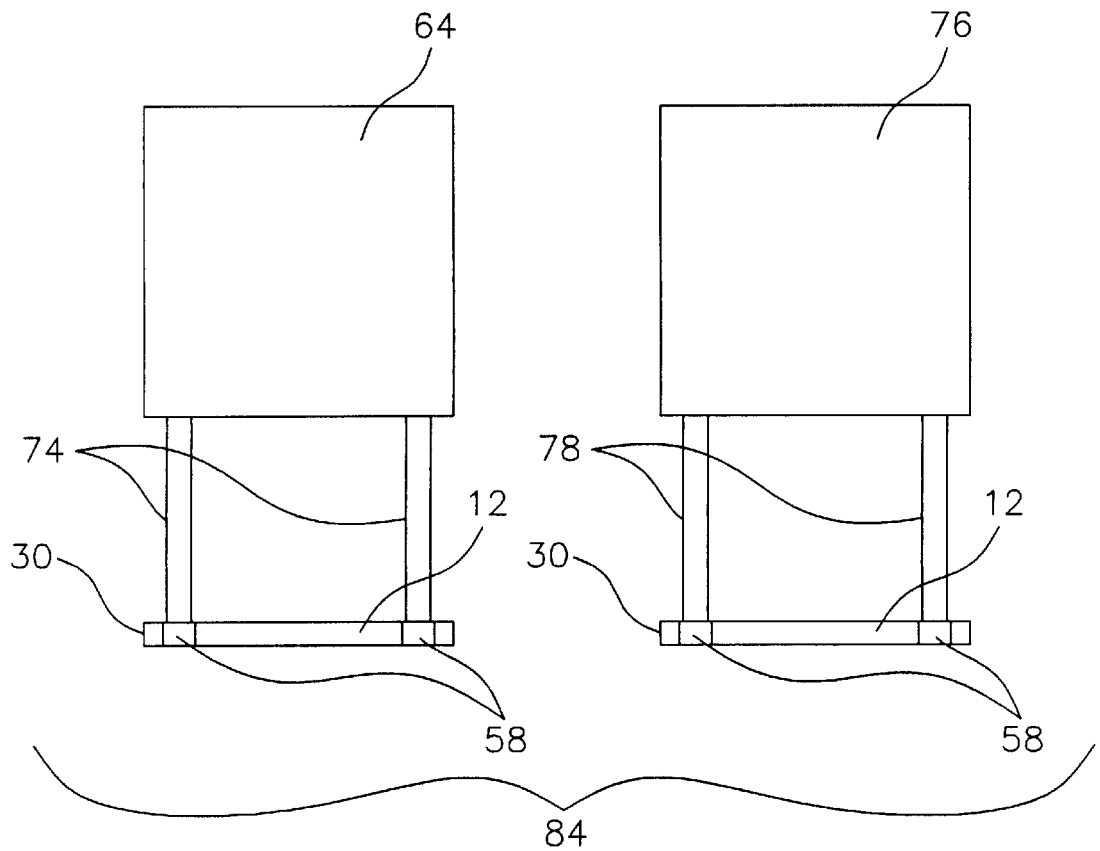
FIG. 5 is a schematic view of a system constructed in accordance with the invention.

Referring to FIG. 5, a system 84 configured to perform the method of the invention is illustrated. The system 84 includes the strip 30 containing the substrates 12. In addition, the substrates 12 are defined by the peripheral openings 58 in the strip 30, and are attached to the strip 30 by the connecting segments 54 (FIG. 3A). The system 84 also includes the molding apparatus 64 having the pins 74 configured to contact the connecting segments 54 (FIG. 3C) during molding of the molded plastic body 18. In addition, the pins 74 form the notches 38 (FIG. 1A) in the molded plastic body 18. The system 84 also includes the punch apparatus 76 having cutters 78 configured to sever the connecting segments 54 (FIG. 3E).

Thus the invention provides an improved semiconductor card, a method for fabricating the card, and a system for performing the method. While the invention has been described with reference to certain preferred embodiments, as will be apparent to those skilled in the art, certain changes and modifications can be made without departing from the scope of the invention as defined by the following claims.

What is claimed is:

1. A semiconductor card comprising:
   a substrate comprising a segment of a strip;
   at least one semiconductor component on the substrate; and
   a plastic body on the substrate at least partially covering the semiconductor component, the plastic body having at least one notch therein configured to at least partially enclose a portion of a connecting segment which initially attaches the substrate to the strip.

2. The semiconductor card of claim 1 wherein the substrate comprises a polymer resin.

3. The semiconductor card of claim 1 further comprising an encapsulant on the substrate encapsulating the semiconductor component.

4. The semiconductor card of claim 1 wherein the plastic body leaves a side of the substrate exposed.

5. The semiconductor card of claim 1 wherein the plastic body comprises an epoxy resin.

6. A semiconductor card comprising:
   a printed circuit substrate which is initially a segment of a strip and initially connected to the strip with a plurality of connecting segments;
   at least one semiconductor component on the substrate; and
   a plastic body molded to the substrate on the semiconductor component, the plastic body comprising an edge portion and a plurality of notches in the edge portion configured to enclose portions of the connecting segments remaining on the substrate.

7. The semiconductor card of claim 6 wherein the substrate comprises a peripheral edge and the plastic body is molded to the peripheral edge.

8. The semiconductor card of claim 6 further comprising an encapsulant on the substrate encapsulating the semiconductor component.

9. The semiconductor card of claim 6 wherein the portions of the connecting segments comprise at least one sliver contained in a notch.

10. The semiconductor card of claim 6 wherein the substrate comprises a circuit side wherein the plastic body is molded and an exposed back side having a plurality of external contacts in electrical communication with the semiconductor component.

11. The semiconductor card of claim 6 wherein the semiconductor component comprises a semiconductor die wire bonded or flip chip mounted to the substrate.

12. The semiconductor card of claim 6 wherein the semiconductor component comprises a semiconductor package bonded to the substrate.

13. The semiconductor card of claim 6 wherein the plastic body comprises an epoxy resin.

14. A semiconductor card comprising:
a printed circuit substrate comprising a circuit side having a plurality of conductors thereon, a back side having a plurality of external contacts thereon in electrical communication with the conductors, and a peripheral edge;
at least one semiconductor component on the circuit side in electrical communication with the conductors; and
a plastic body molded to the circuit side and the peripheral edge and covering the semiconductor component, the plastic body comprising an edge portion and at least one notch in the edge portion configured to enclose a selected portion of the peripheral edge such that an outline of the card is not affected by a sliver on the selected portion, the sliver comprising a portion of a connecting segment configured to attach the substrate to a panel.

15. The semiconductor card of claim 14 further comprising an encapsulant on the circuit side encapsulating the semiconductor component.

16. The semiconductor card of claim 14 wherein the notch has a generally hemispherical shape.

17. A semiconductor card comprising:
a printed circuit substrate comprising a circuit side having a plurality of conductors thereon, a back side having a plurality of external contacts thereon in electrical communication with the conductors, and a peripheral edge;
at least one semiconductor component on the circuit side in electrical communication with the conductors;
an encapsulant on the circuit side encapsulating the semiconductor component; and
a plastic body molded to the circuit side and the peripheral edge and covering the semiconductor component, the plastic body comprising an edge portion and at least one notch in the edge portion configured to enclose a selected portion of the peripheral edge such that an outline of the card is not affected by a sliver on the selected portion.

18. The semiconductor card of claim 17 wherein the semiconductor component comprises a die wire bonded or flip chip mounted to the substrate.

19. The semiconductor card of claim 17 wherein the semiconductor component comprises a package having contacts bonded to the substrate.

20. A semiconductor card comprising:
a printed circuit substrate comprising a reinforced organic polymer resin, the substrate initially defined by a peripheral opening in a strip and attached to the strip with a plurality of connecting segments, the substrate having a circuit side, a back side with a plurality of external contacts thereon, and a peripheral edge;
at least one semiconductor component on the circuit side in electrical communication with the external contacts; and
a plastic body molded to the circuit side and to the peripheral edge and covering the semiconductor component while leaving the back side exposed, the plastic body comprising a plurality of notches configured to enclose portions of the peripheral edge proximate to the connecting segments.

21. The semiconductor card of claim 20 wherein at least one portion of the peripheral edge comprises a sliver of a connecting segment.

22. The semiconductor card of claim 20 wherein the notches are generally hemispherical in shape.

23. The semiconductor card of claim 20 wherein the plastic body comprises a novolac epoxy resin.

24. The semiconductor card of claim 20 wherein the plastic body comprises four notches.

25. A method for fabricating a semiconductor card comprising:
providing a strip comprising a substrate and at least one connecting segment connecting the substrate to the strip;
mounting at least one semiconductor component to the substrate;
molding a plastic body on the substrate and over the semiconductor component; and
forming a notch in the plastic body during the molding step configured to enclose an edge portion of the substrate proximate to the connecting segment.

26. The method of claim 25 wherein the molding step is performed by placing a pin in contact with the connecting segment to form the notch.

27. The method of claim 25 wherein the substrate comprises a circuit side and a peripheral edge and the plastic body is molded to the circuit side and to the peripheral edge.

28. The method of claim 25 wherein the plastic body comprises an epoxy resin.

29. The method of claim 25 wherein the substrate comprises a reinforced organic polymer resin.

30. The method of claim 25 wherein the mounting step comprises wire bonding or flip chip mounting the semiconductor component to the substrate.

31. A method for fabricating a semiconductor card comprising:
providing a strip comprising a plurality of substrates, the strip comprising a plurality of peripheral openings defining the substrates and a plurality of connecting segments attaching the substrates to the strip;
mounting a plurality of semiconductor components to the substrates;
molding a plurality of plastic bodies to the substrates;
placing a plurality of pins on the connecting segments during the molding step configured to form a plurality of notches in the plastic bodies proximate to the connecting segments; and
severing the connecting segments using the notches to provide access and to enclose portions of the connecting segments which remain following the severing step.

32. The method of claim 31 wherein the severing step is performed by placing cutters through the notches.

33. The method of claim 31 wherein the substrates comprise peripheral edges and the plastic bodies are molded to the peripheral edges.

34. The method of claim 31 further comprising encapsulating the semiconductor components with an encapsulant and covering the encapsulant with the plastic bodies.

35. The method of claim 31 wherein the substrates comprise circuit sides wherein the semiconductor components are mounted and back side which are not covered by the plastic bodies.

36. A method for fabricating a semiconductor card comprising:

providing a strip comprising a plurality of reinforced organic polymer substrates, the strip comprising a plurality of peripheral openings defining the substrates and a plurality of connecting segments attaching the substrates to the strip;

mounting a plurality of semiconductor components to the substrates;

providing a molding apparatus comprising a plurality of mold cavities containing a plurality of pins configured to contact the connecting segments and to mold plastic bodies on the substrate having notches aligned with the connecting segments;

molding the plastic bodies to the substrates using the molding apparatus;

providing a punch apparatus comprising a plurality of cutters configured to move through the notches to sever the connecting segments; and severing the connecting segments using the punch apparatus.

37. The method of claim 36 wherein the substrate comprise peripheral edges and the notches are located proximate to the peripheral edges and are configured to enclose portions of the connecting segments which remain following the severing step.

38. The method of claim 36 wherein the mounting step comprises wire bonding the semiconductor components to the substrate.

39. The method of claim 36 wherein the mounting step comprises flip chip mounting the semiconductor components to the substrate.

40. The method of claim 36 wherein the mounting step comprises bonding the semiconductor components to the substrate.

41. A method for fabricating a semiconductor card comprising:

providing a strip comprising a substrate and a plurality of connecting segments connecting the substrate to the strip, the substrate comprising a circuit side, a back side having a plurality of external contacts and a peripheral edge;

mounting at least one semiconductor component to the circuit side in electrical communication with the external contacts;

molding a plastic body on the circuit side comprising an edge portion on the peripheral edge;

forming a plurality of notches in the edge portion during the molding step proximate to the peripheral edge; and severing the connecting segments by moving cutters through the notches.

42. The method of claim 41 further comprising encapsulating the semiconductor component prior to the molding step.

43. The method of claim 41 wherein the molding step is performed using a mold cavity having a plurality of pins for contacting the connecting segments.

44. The method of claim 41 wherein the plastic body comprises an epoxy resin.

45. The method of claim 41 wherein the mounting step comprises wire bonding, bonding or flip chip mounting the semiconductor components.

46. A system for fabricating a semiconductor card comprising:

a strip comprising a plurality of reinforced organic polymer substrates, the strip comprising a plurality of peripheral openings defining the substrates and a plurality of connecting segments attaching the substrates to the strip; and a molding apparatus comprising a plurality of mold cavities containing a plurality of pins configured to contact the connecting segments and to mold plastic bodies on the substrate having notches aligned with the connecting segments.

47. The system of claim 46 further comprising a punch apparatus comprising a plurality of cutters configured to move through the notches to sever the connecting segments.

48. The system of claim 46 the substrates comprise circuit sides, back sides and peripheral edges and the molding apparatus is configured to mold the plastic bodies to the circuit sides and to the peripheral edges.

49. The system of claim 46 wherein the notches are configured to enclose slivers of the connecting segments.

50. The system of claim 46 wherein the molding apparatus is configured to mold an epoxy resin to form the plastic bodies.

* * * * *

UNITED STATES PATENT AND TRADEMARK OFFICE
CERTIFICATE OF CORRECTION

PATENT NO.    : 6,462,273 B1
DATED         : October 8, 2002
INVENTOR(S)   : David J. Corisis and Todd O. Bolken It is certified that error appears in the above-identified patent and that said Letters Patent is hereby corrected as shown below:

Column 10,
Line 64, change "side" to -- sides --.

Column 12,
Line 34, after "46" add -- wherein --.

Signed and Sealed this

Fourth Day of February, 2003

JAMES E. ROGAN
*Director of the United States Patent and Trademark Office*